United States Patent
Lim et al.

(10) Patent No.: US 9,224,722 B2
(45) Date of Patent: Dec. 29, 2015

(54) SEMICONDUCTOR APPARATUS CAPABLE OF DETECTING WHETHER PAD AND BUMP ARE STACKED

(71) Applicant: SK hynix Inc., Icheon-si Gyeonggi-do (KR)

(72) Inventors: Soo Bin Lim, Icheon-si (KR); Jong Chern Lee, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/265,961

(22) Filed: Apr. 30, 2014

(65) Prior Publication Data

US 2015/0206867 A1    Jul. 23, 2015

(30) Foreign Application Priority Data

Jan. 20, 2014    (KR) .................. 10-2014-0006653

(51) Int. Cl.
   *H01L 23/48* (2006.01)
   *H01L 25/18* (2006.01)
   *H01L 25/065* (2006.01)
   *H01L 23/00* (2006.01)
   *H01L 23/498* (2006.01)

(52) U.S. Cl.
   CPC .............. *H01L 25/18* (2013.01); *H01L 23/481* (2013.01); *H01L 25/0652* (2013.01); *H01L 23/49816* (2013.01); *H01L 23/49827* (2013.01); *H01L 24/05* (2013.01); *H01L 24/13* (2013.01); *H01L 24/16* (2013.01); *H01L 24/17* (2013.01); *H01L 2224/0401* (2013.01); *H01L 2224/0557* (2013.01); *H01L 2224/13025* (2013.01); *H01L 2224/16146* (2013.01); *H01L 2224/16225* (2013.01); *H01L 2224/17181* (2013.01); *H01L 2225/06513* (2013.01); *H01L 2225/06517* (2013.01); *H01L 2225/06541* (2013.01); *H01L 2924/14* (2013.01); *H01L 2924/1431* (2013.01); *H01L 2924/1432* (2013.01); *H01L 2924/1433* (2013.01); *H01L 2924/1434* (2013.01); *H01L 2924/14335* (2013.01); *H01L 2924/15192* (2013.01)

(58) Field of Classification Search
   None
   See application file for complete search history.

(56) References Cited

U.S. PATENT DOCUMENTS

| | | | | |
|---|---|---|---|---|
| 6,140,827 | A * | 10/2000 | Wark ..................... | 324/756.05 |
| 2004/0257847 | A1* | 12/2004 | Matsui et al. ................ | 365/63 |
| 2012/0212990 | A1* | 8/2012 | Park et al. ................... | 365/63 |
| 2013/0320560 | A1* | 12/2013 | Secker et al. ................ | 257/774 |
| 2015/0115268 | A1* | 4/2015 | Park ........................... | 257/48 |
| 2015/0115435 | A1* | 4/2015 | Park et al. .................... | 257/737 |
| 2015/0177320 | A1* | 6/2015 | Lee .................... | G01R 31/3177 |
| 2015/0198653 | A1* | 7/2015 | Park ................... | G01R 31/2607 |
| | | | | 324/762.01 |

* cited by examiner

*Primary Examiner* — Marc Armand
*Assistant Examiner* — Younes Boulghassoul
(74) *Attorney, Agent, or Firm* — William Park & Associates Ltd.

(57) ABSTRACT

A semiconductor apparatus may include a semiconductor chip, and the semiconductor chip may include a first pad, a second pad, and a bump. The first pad may be configured to receive a signal from an external device, and the second pad may include first and second metal layers electrically isolated from each other. The bump may be stacked over the second pad, and may be configured to receive a signal from a controller chip.

11 Claims, 7 Drawing Sheets

SEMICONDUCTOR APPARATUS CAPABLE OF DETECTING WHETHER PAD AND BUMP ARE STACKED

CROSS-REFERENCES TO RELATED APPLICATION

The present application claims priority under 35 U.S.C. §119(a) to Korean application number 10-2014-0006653, filed on Jan. 20, 2014 in the Korean Intellectual Property Office, which is incorporated herein by reference in its entirety as set forth in full.

BACKGROUND

1. Technical Field

Various embodiments generally relate to a semiconductor apparatus, and more particularly, to a semiconductor system including a pad and a bump having a metal layer.

2. Related Art

In order to improve the degree of integration within a semiconductor apparatus, a 3-dimensional (3D) semiconductor apparatus may be used. Integration within the 3D semiconductor apparatus may be improved by stacking and packaging a plurality of chips in a single package. A 3D semiconductor apparatus may have two or more vertically stacked chips and to help achieve the highest degree of integration within the limited space a semiconductor apparatus provides.

There are various ways to implement a 3D semiconductor apparatus. One of these ways are to stack a plurality of chips having the same structure and then couple the stacked chips to each other with a wire such as a metal line. This may allow the plurality of chips to act as a single semiconductor apparatus.

Another way to couple the stacked chips would be to use a, Through Silicon Via (TSV) scheme to pass through the stacked chips with a via. Using these TSVs may electrically couple all of the stacked chips. A TSV-implemented semiconductor apparatus uses TSVs to vertically pass through and couple the stacked chips. Using this scheme can efficiently reduce a package area of a semiconductor apparatus more than a scheme which implements the wire-implemented semiconductor apparatus. The wire-implemented semiconductor apparatus coupling the stacked chips through wires disposed in the border area of the chips.

Chips having the TSVs may be stacked through a metal pad and bump. The metal pad may be electrically coupled to the TSV and the bump may be stacked over the metal pad so that a signal input through the bump may be transferred to another semiconductor chip through the metal pad and the bump.

SUMMARY

In an embodiment, a semiconductor apparatus may include a first pad configured to receive a signal external to the semiconductor apparatus, and a second pad including first and second metal layers electrically isolated from each other. The semiconductor apparatus may also include a controller chip configured to transmit a signal to a bump, and a semiconductor chip stacked over the second pad and including the bump configured to receive a signal from the controller chip.

In an embodiment, a semiconductor apparatus may include an interposer substrate, and a first semiconductor chip including an interface pad having first and second metal layers and a bump stacked over the first and second metal layers thereby providing electrical connection to the interposer substrate. The semiconductor apparatus may also include a second semiconductor chip stacked with the first semiconductor chip, and a controller chip stacked over the interposer substrate and configured to communicate with the first semiconductor chip through the interposer substrate.

In an embodiment, a semiconductor apparatus may include a semiconductor chip including a second pad including a first metal layer coupled to a first pad and a second metal layer coupled to a through-via, and a bump stacked adjacent to the first and second metal layers. The first and second metal layers may be electrically isolated from each other.

In an embodiment, a semiconductor apparatus may include a semiconductor chip including a direct access pad configured to receive data from outside the semiconductor device, and an interface pad including first and second metal layers, which are electrically isolated from each other, and over which a bump is stacked. The semiconductor apparatus may also include a write unit electrically coupled to the second metal layer, and configured to transmit data, which is received from the second metal layer, to a through-via, and a read unit configured to receive data, which is transmitted from the through-via, to the direct access pad.

DETAILED DESCRIPTION

Hereinafter, semiconductor apparatuses will be described below with reference to the accompanying drawings through various examples of embodiments.

To ensure operational reliability of the TSV-implemented 3D semiconductor apparatus, it may be important to check whether or not the TSV has a defect and that the bump is normally stacked over the metal pad.

Figure 1:
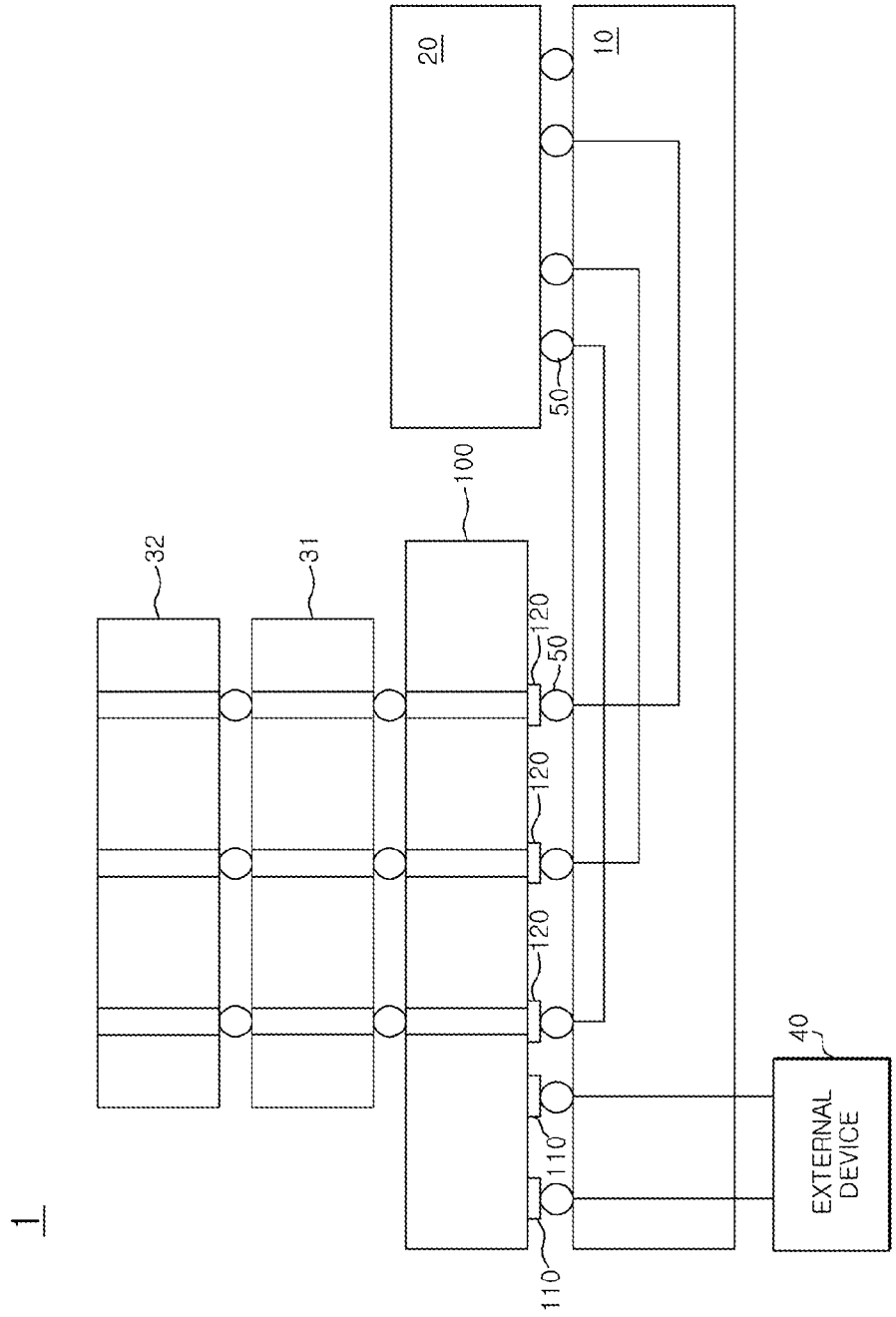
FIG. 1 is a schematic vertical diagram illustrating a representation of semiconductor apparatus in accordance with an embodiment.

Thus, with reference to FIG. 1, the semiconductor apparatus 1 may include an interposer substrate 10, and a controller chip 20. The semiconductor apparatus 1 may also include a first semiconductor chip 100 and a plurality of second semiconductor chips 31 and 32. The controller chip 20 and the first semiconductor chip 100 may be stacked over the interposer substrate 10. The plurality of second semiconductor chips 31 and 32 may be sequentially stacked over the first semiconductor chip 100. The interposer substrate 10, the controller chip 20, the first semiconductor chip 100, and the plurality of second semiconductor chips 31 and 32 may be packaged together into a single package and included in the single semiconductor apparatus 1.

The interposer substrate 10 may serve as an interface chip. The interposer substrate 10 may route communications between the controller chip 20 and the first semiconductor chip 100. The controller chip 20 may include, for example but not limited to, the following: a memory controller, a Central Processing Unit (CPU), a graphic processing unit (GPU), a digital signal processor (DSP), one or more process cores, a single core processor, a dual core processor, a multiple core processor, a micro-processor, a host processor, a controller, a plurality of processors or controllers, a chip, a micro-chip, a logic circuit, an integrated circuit (IC), or an application-specific IC. Also, the interposer substrate 10 may provide a signal path between an external device 40 and the first semiconductor chip 100. The external device 40 may directly access the semiconductor apparatus 1. For example, the external device 40 may be a test device etc. The interposer substrate 10 may be stacked and electrically coupled with the controller chip 20 and the first semiconductor chip 100 with a bump 50 or a plurality of bumps 50.

The first semiconductor chip 100 may include a plurality of pads. The first semiconductor chip 100 may receive a signal transmitted from the interposer substrate 10 through the bumps 50 and the plurality of pads. The first semiconductor chip 100 may include a direct access pad 110 and an interface pad 120. The direct access pad 110 may be coupled to the external device 40. The external device 40 may directly communicate a signal with the first semiconductor chip 100 through the direct access pad 110. For example, when the first semiconductor chip 100 is not stacked with the interposer substrate 10, the direct access pad 110 may be coupled to the external device 40 without any intermediate medium. After the first semiconductor chip 100 is stacked with the interposer substrate 10 the external device 40 may be electrically coupled to the direct access pad 110 through coupling to the interposer substrate 10.

The interface pad 120 may be coupled to the controller chip 20 through the signal path formed on the interposer substrate 10. Therefore, a signal transmitted from the controller chip 20 may be received by the first semiconductor chip 100 through the interface pad 120. Also, a signal generated by the first semiconductor chip 100 may be outputted to the controller chip 20 through the interface pad 120.

The first semiconductor chip 100 may perform data communication with the controller chip 20. Also, the first semiconductor chip 100 may control input/output operation of the plurality of second semiconductor chips 31 and 32. The first semiconductor chip 100 may be a base chip, a logic chip, or a lower chip performing data communication with the plurality of second semiconductor chips 31 and 32. The plurality of second semiconductor chips 31 and 32 may comprise of memory chips. The first semiconductor chip 100 may have the same structure or substantially the same structure as the plurality of second semiconductor chips 31 and 32. In an example of an embodiment, the first semiconductor chip 100 may include a peripheral circuit for storing and outputting data. The plurality of second semiconductor chips 31 and 32 may include a memory core, in which data may be stored.

Figure 2A:
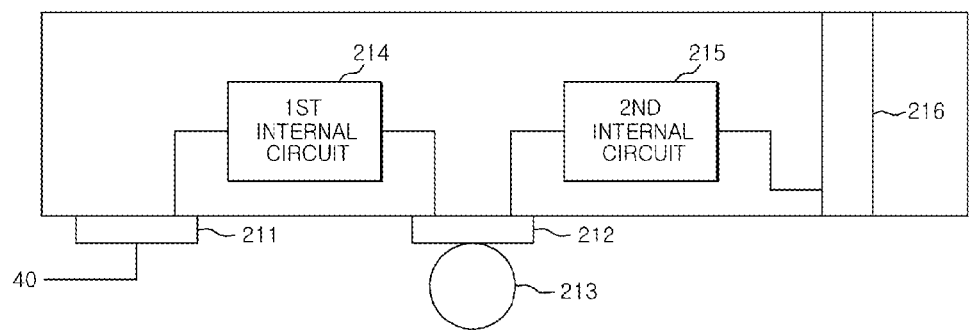
FIGS. 2A and 2B are schematic vertical diagrams illustrating a representation of first semiconductor chips in accordance with an embodiment.
Figure 2B:
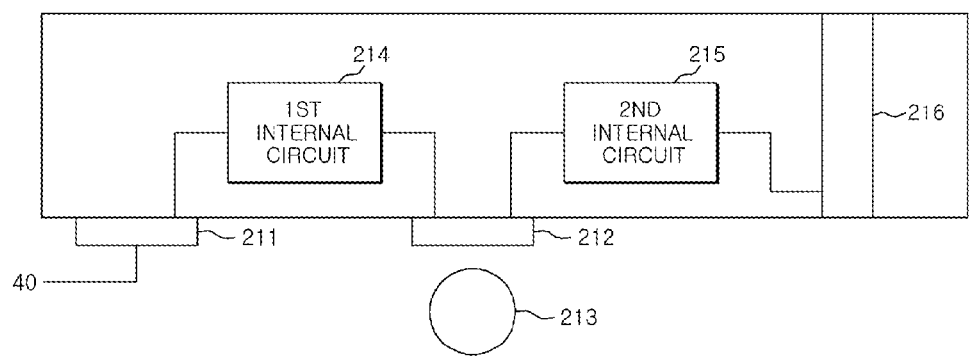

FIGS. 2A and 2B are schematic vertical diagrams illustrating a representation of first semiconductor chips 210 and 220 in accordance with an example of an embodiment. Referring to FIGS. 2A and 2B, each of the first semiconductor chips 210 and 220 may include a first pad 211, and a second pad 212. Each first semiconductor chip 210 and 220 may also include a bump 213, and a first internal circuit 214. Additionally, each first semiconductor chip 210 and 220 may include a second internal circuit 215, and a through-via 216. The first pad 211 may be the direct access pad for receiving a signal from the external device 40. The second pad 212 may be the interface pad for receiving a signal from the controller chip 20. Each of first pad 211 and second pad 212 may include a metal layer having conductivity. The bump 213 may be stacked over the second pad 212. The bump 213 may be stacked with the interposer substrate 10. The first and second internal circuits 214 and 215 may be included in each of the first semiconductor chips 210 and 220. For example but not limited to, the first and second internal circuits 214 and 215 may be a repeater and a driver circuit for signal transmission. Also, the connection relationship between the first and second internal circuits 214 and 215, or the first and second pads 211 and 212 may be shown as an example in the drawings for the sake of convenience, but is not limitative. The first internal circuit 214 may be electrically coupled to the first pad 211 and the second pad 212. The second internal circuit 215 may be electrically coupled to the second pad 212 and the through-via 216. A signal inputted from the first pad 211 may be transmitted to the second pad 212 through the first internal circuit 214. Also, a signal transmitted to the second pad 212 may be transmitted to the through-via 216 through the second internal circuit 215. The through-via 216 may provide a signal path for transmitting a signal to another semiconductor chip, for example the plurality of second semiconductor chips 31 and 32 illustrated in FIG. 1. The second semiconductor chips 31 and 32 may be stacked with each of the first semiconductor chips 210 and 220.

As illustrated in FIGS. 2A and 2B, each of the first semiconductor chips 210 and 220 may receive a signal inputted to the first pad 211 through the first internal circuit 214, the second pad 212, and the second internal circuit 215. A signal inputted through the first pad 211 may be transmitted through the second pad 212 including the metal layer, and therefore the signal may be transmitted to the second internal circuit 215 regardless of whether or not normal contact exists between the bump 213 and the second pad 212. Accordingly, as illustrated in FIG. 2B, the first semiconductor chip 220 may receive and transmit the signal inputted through the first pad 211 through both the first internal circuit 214 and the second pad 212 and to the second internal circuit 215 even though the bump 213 is not in contact with the second pad 212. Here, there may be a need for a scheme to detect if there is or isn't normal contact between the bump 213 and the second pad 212.

Figure 3:
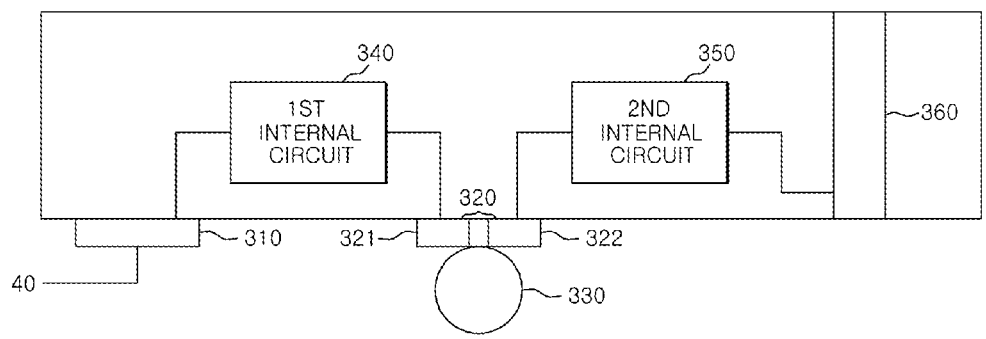
FIG. 3 is schematic vertical diagram illustrating a representation of a first semiconductor chip in accordance with an embodiment.

FIG. 3 is schematic vertical diagram illustrating a representation of a first semiconductor chip 300 in accordance with an embodiment. As illustrated in FIG. 3, the first semiconductor chip 300 may include a first pad 310, and a second pad 320. The first semiconductor chip 300 may include a bump 330, and a first internal circuit 340. The first semiconductor chip 300 may also include a second internal circuit 350 and a through-via 360. The first pad 310 may be the direct access pad for receiving a signal from the external device 40. The second pad 320 may be the interface pad for receiving a signal from the controller chip 20 (see FIG. 1).

The second pad 320 may include first and second metal layers 321 and 322. The first and second metal layers 321 and 322 may be physically and electrically isolated to each other. The bump 330 may be stacked over the second pad 320. The second pad 320 including, for example, first and second metal layers 321 and 322. The bump 330 may be coupled to both of the first and second metal layers 321 and 322. The first internal circuit 340 may be coupled to the first pad 310. The first internal circuit 340 may also be coupled to the first metal layer 321 of the second pad 320. The second internal circuit 350 may be coupled to the second metal layer 322 of the second pad 320. The second internal circuit 350 may also be coupled to the through-via 360. A signal inputted through the first pad 310 may be transmitted to the second metal layer 322 of the second pad 320 and the second internal circuit 350 through the first internal circuit 340, the first metal layer 321 of the second pad 320, and the bump 330. Therefore, when the bump 330 does not make normal contact or contact with at least one of the first and second metal layers 321 and 322, the signal, for example, received by the first pad 310 may not be transmitted to the second internal circuit 350 and/or the through-via 360. The first semiconductor chip 300 may detect whether or not there exits normal contact or contact between the bump 330 and the second pad 320. This detection is performed by checking whether or not the signal inputted through the first pad 310 is transmitted to the second internal circuit 350 and/or the through-via 360.

Figure 4:
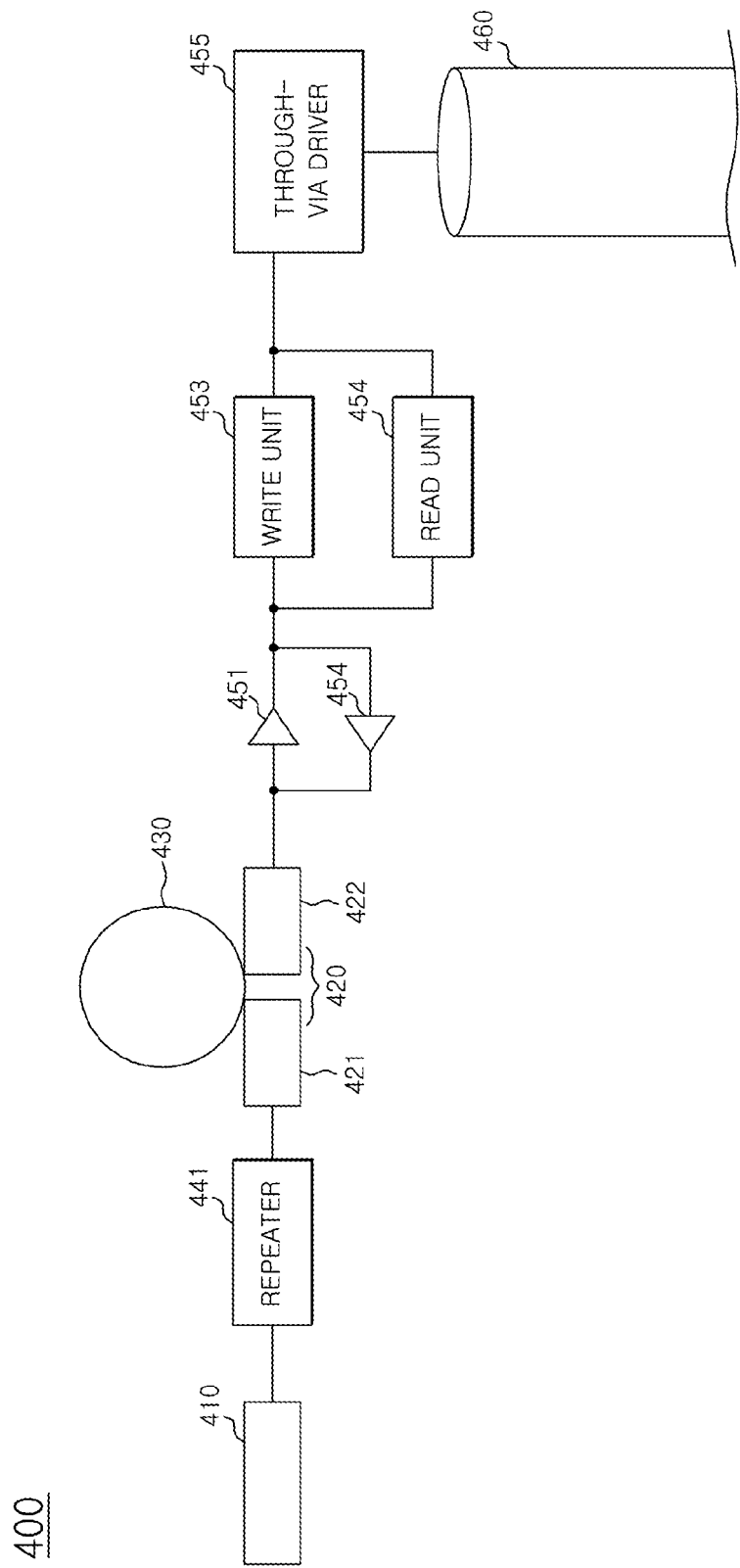
FIG. 4 is block diagram illustrating a representation of a first semiconductor chip in accordance with an embodiment.

FIG. 4 is block diagram illustrating a representation of a first semiconductor chip 400 in accordance with an embodiment. Referring to FIG. 4, the first semiconductor chip 400 may include a first pad 410, and a second pad 420. The first semiconductor chip 400 may also include a bump 430, and a through-via 460. The first pad 410 may be, for example, the direct access pad for receiving a signal from the external device 40 (see FIG. 1). The second pad 420 may be, for example, the interface pad for receiving a signal from the controller chip 20 (see FIG. 1). The second pad 420 may include first and second metal layers 421 and 422. The first and second metal layers 421 and 422 may be physically and/or electrically isolated from each other. The bump 430 may be stacked over the second pad 420, and the bump 430 may be coupled to both the first and second metal layers 421 and 422. The through-via 460 may provide a signal path for the first semiconductor chip 400 to transmit a signal to another semiconductor chip, for example the plurality of second semiconductor chips 31 and 32 shown in FIG. 1, which may be stacked with the first semiconductor chip 400.

Referring to FIG. 4, the first semiconductor chip 400 may further include a repeater 441, and a plurality of buffers 451 and 452. The first semiconductor chip 400 may also include a write unit 453, a read unit 454, and a through-via driver 455. The repeater 441 may buffer a signal inputted through the first pad 410. The repeater 441 may transmit the buffered signal to the first metal layer 421 of the second pad 420. The buffer 451 may be coupled to the second metal layer 422 of the second pad 420, and receive a signal transmitted through the first metal layer 421 and the bump 430. The write unit 453 may transmit a signal to another semiconductor chip stacked with the first semiconductor chip 400. For example, when the signal is data, the write unit 453 may convert serial data, which is used in communication between a host device and the semiconductor apparatus 1, into parallel data, which is internally used in the semiconductor apparatus 1. Conversely to the write unit 453, the read unit 454 may convert parallel data internally used in the semiconductor apparatus 1 to serial data in order to output to the hose device. The buffer 454 may transmit a signal, which is outputted from the read unit 454 and buffered, to the second metal layer 422. The through-via driver 455 may transmit a signal outputted from the write unit 453 to another semiconductor chip stacked with the first semiconductor chip 400 through the through-via 460 by driving the signal outputted from the write unit 453. The through-via driver 455 may output a signal transmitted through the through-via 460 to the read unit 454 by driving the signal transmitted through the through-via 460. The repeater 441, for example, may be the first internal circuit 340 described above with reference to FIG. 3. Additionally, the plurality of buffers 451 and 454, the write unit 453, the read unit 454, and the through-via driver 455 may be the second internal circuit 350 described above with reference to FIG. 3.

The first semiconductor chip 400 may receive a signal from the external device 40 through the first pad 410. The signal may be transmitted to the through-via 460 sequentially through the first metal layer 421, the bump 430, and the second metal layer 422. Therefore, when the bump 430 is not in contact with at least one of the first and second metal layers 421 and 422, the electrical connection path between the first pad 410 and the through-via 460 may be blocked. Thus in an embodiment, the semiconductor apparatus 1 may input a signal to the first pad 410, to detect whether or not the inputted signal is normally transmitted to an internal circuit of the first semiconductor chip 400. Thus, detecting whether or not there is normal contact between the bump 430 and the second pad 420 including the first and second metal layers 421 and 422.

Figure 5:
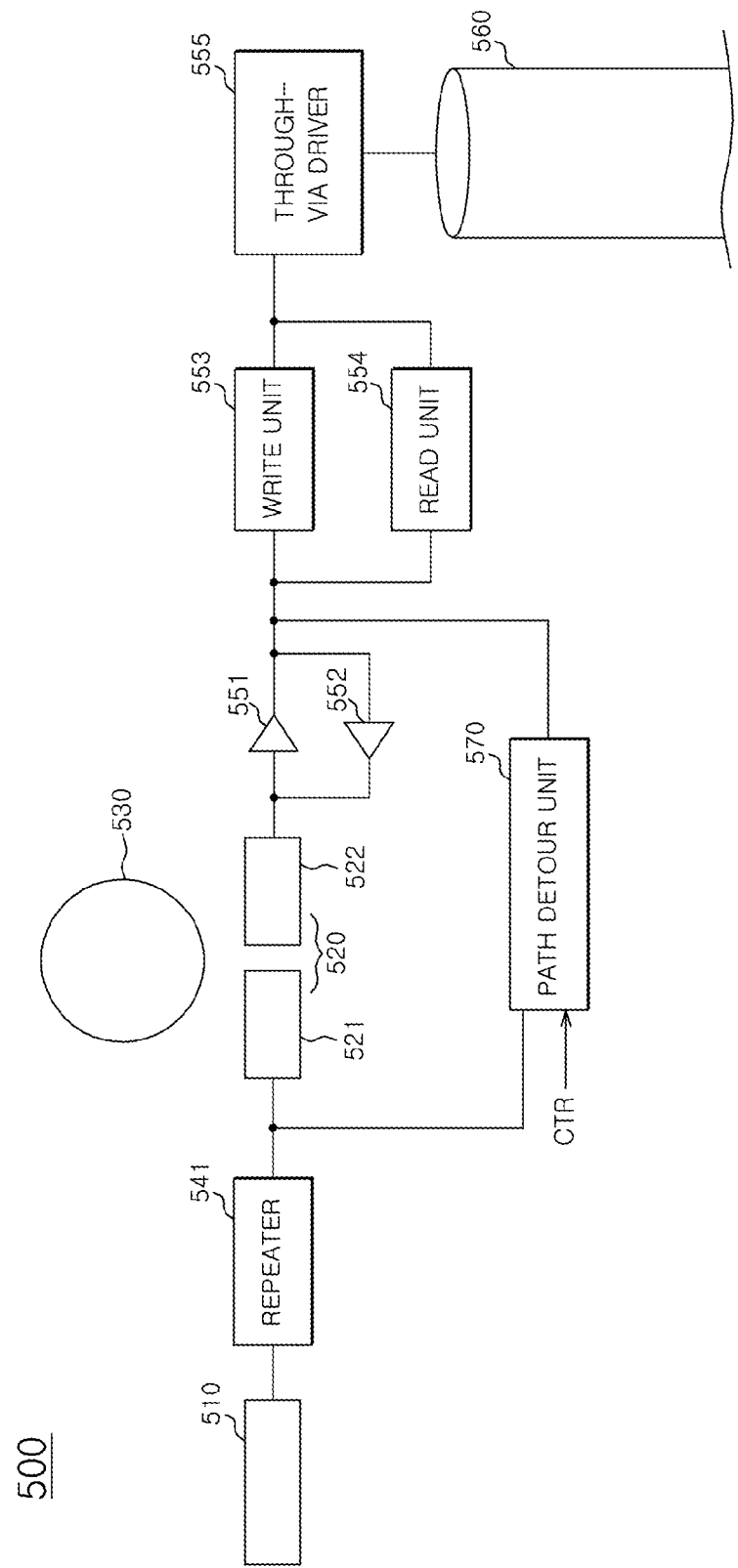
FIG. 5 is block diagram illustrating a representation of a first semiconductor chip in accordance with an embodiment.

FIG. 5 is block diagram illustrating a representation of a first semiconductor chip 500 in accordance with an embodiment. FIG. 5 shows, for example, a contact defect between the bump 530 and the second pad 520. Referring to FIG. 5, when the bump 530 is not in contact with the first and second metal layers 521 and 522 of the second pad 520, a signal inputted through the first pad 510 may not be transmitted to the through-via 560 through the second pad 520. In these examples, it may be determined that a defect occurred in the first semiconductor chip 500, and also it may be determined that a defect occurred in another semiconductor chip stacked with the first semiconductor chip 500. Therefore, the first semiconductor chip 500 may further include a path detour unit 570. The path detour unit 570 may electrically couple the first and second metal layers 521 and 522 in response to a control signal CTR. For example, the path detour unit 570 may have one end electrically coupled between the repeater 541 and the first metal layer 521 of the second pad 520, and the other end electrically coupled between the plurality of buffers 551 and 552, and the write unit 553 and the read unit 554. Therefore, the path detour unit 570 may provide an additional signal path for transferring the signal received by the first pad 510 and transmitted to the through-via driver 555 and the through-via 560 when the bump 530 does not make normal contact with the second pad 520 (i.e., when the bump 530 does not make contact with both the first metal layer 521 and the second metal layer 522). The control signal CTR may be generated when the bump 530 does not make normal contact with the second pad 520. Any test mode signal, any signal internally generated in the semiconductor apparatus 1, and any signal externally inputted from the controller chip 20 and/or the external device 40 may serve as the control signal CTR. Also, the path detour unit 570 may include a logic gate, for example but not limited to, a pass gate etc.

Figure 6:
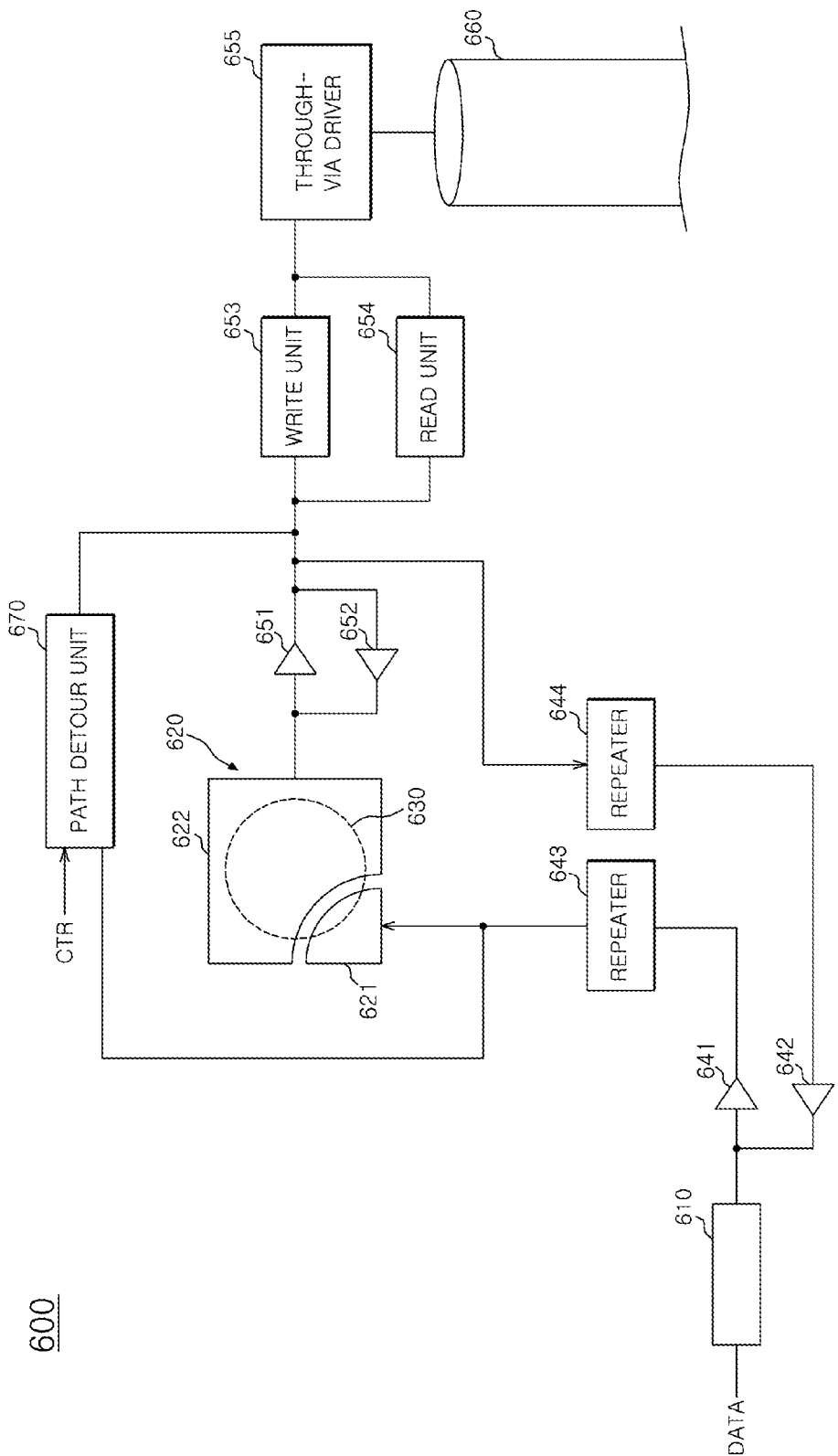
FIG. 6 is schematic horizontal diagram illustrating a representation of a first semiconductor chip in accordance with an embodiment.

FIG. 6 is schematic horizontal diagram illustrating a representation of a first semiconductor chip 600 in accordance with an example of an embodiment. Referring to FIG. 6, the first semiconductor chip 600 may include a first pad 610, and a second pad 620. The first semiconductor chip 600 may also include a through-via 660 and a path detour unit 670. The first pad 610 may be, for example, the direct access pad for receiving a signal from the external device 40. The second pad 620 may be, for example, the interface pad for receiving a signal from the controller chip 20. A signal inputted from the external device 40 and the controller chip 20 may be data DATA. The second pad 620 may include first and second metal layers 621 and 622. The first and second metal layers 621 and 622 may be electrically isolated from each other. As illustrated in FIG. 6, the first metal layer 621 may be coupled to the first pad 610, and the second metal layer 622 may be coupled to the through-via 660. The bump 630 may be stacked over the second pad 620, and to both the first and second metal layers 621 and 622. The through-via 660 may provide a signal path for transmitting a signal to another semiconductor chip stacked with the first semiconductor chip 600. The path detour unit 670 may electrically couple the first and second metal layers 621 and 622 to each other in response to a control signal CTR. The control signal CTR may be generated when the bump 630 does not make contact with at least one of the first and second metal layers 621 and 622.

The first semiconductor chip 600 may further include a plurality of buffers 641, 642, 651 and 652, and a plurality of repeaters 643 and 644. The first semiconductor chip 600 may also include a write unit 653, a read unit 654, and a through-via driver 655. The write unit 653 may be electrically coupled to the second metal layer 622, and output data DATA transmitted through the second metal layer 622 to the through-via 660. The read unit 654 may output data DATA transmitted through the through-via 660 to the direct access pad 610. In an example of an embodiment, the read unit 654 may provide data DATA transmitted through the through-via 660 directly to the first pad 610 without involving the second pad 620. Routes for data DATA in the first semiconductor apparatus 600 may be as follows. Data DATA inputted through the first pad 610 may be transmitted to the first metal layer 610 through the buffer 641 and the repeater 643. When the bump 630 makes normal contact with the first and second metal layers 621 and 622, the data DATA may be transmitted to the second metal layer 622 through the bump 630. The data DATA transmitted to the second metal layer 622 may be transmitted to the through-via driver 655 and the through-via 660 through the buffer 651 and the write unit 653. Conversely, the data DATA transmitted through the through-via 660 may be transmitted to the repeater 644 through the read unit 654. The data DATA may be outputted to the external device 40 through the buffer 642 and the first pad 610.

When the bump 630 does not make contact with at least one of the first and second metal layers 621 and 622, the path detour unit 670 may couple the first and second metal layers 621 and 622 to one another, or bypass the first and second metal layers 621 and 622 to couple the first pad 610 with the through-via 660. In this way, the data DATA transmitted from the first pad 610 may be transmitted to the write unit 653 through the path detour unit 670 even though the data DATA transmitted from the first pad 610 may not be transmitted through the second pad 620.

Figure 7:
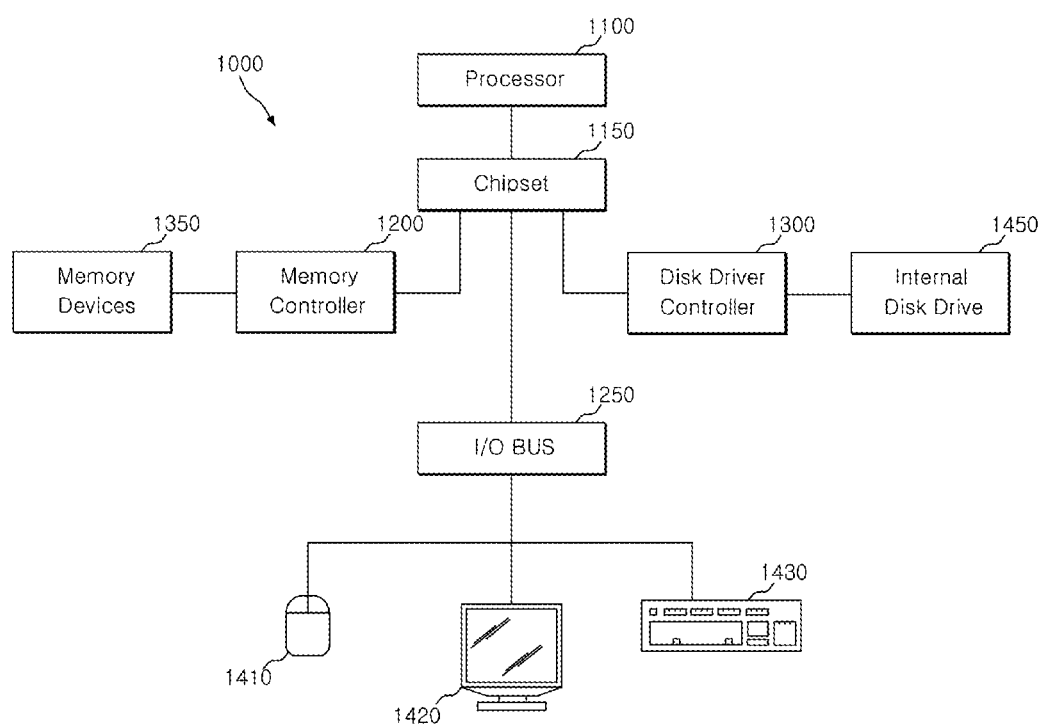
FIG. 7 illustrates a block diagram representation of a system employing the semiconductor apparatus in accordance with the embodiments discussed above with relation to FIGS. 1-6.

The semiconductor apparatus discussed above is particular useful in the design of memory devices, processors, and computer systems. For example, referring to FIG. 7, a block diagram of a system employing the semiconductor apparatus in accordance with the embodiments are illustrated and generally designated by a reference numeral 1000. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented.

A chipset 1150 may be operably coupled to the CPU 1100. The chipset 1150 is a communication pathway for signals between the CPU 1100 and other components of the system 1000, which may include a memory controller 1200, an input/output ("I/O") bus 1250, and a disk drive controller 1300. Depending on the configuration of the system, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be operably coupled to the chipset 1150. The memory controller 1200 may include at least one semiconductor apparatus as discussed above with reference to FIGS. 1-6. Thus, the memory controller 1200 can receive a request provided from the CPU 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the semiconductor apparatus as discussed above with relation to FIGS. 1-6, the memory devices 1350 may include a plurality of word lines and a plurality of bit lines for defining a plurality of memory cell. The memory devices 1350 may be any one of a number of industry standard memory types, including but not limited to, single inline is memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 (i.e., internal disk drive) may also be operably coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

It is important to note that the system 1000 described above in relation to FIG. 7 is merely one example of a system employing the semiconductor apparatus as discussed above with relation to FIGS. 1-6. In alternate embodiments, such as cellular phones or digital cameras, the components may differ from the embodiments shown in FIG. 7.

While various embodiments have been described above, it will be understood to those skilled in the art that the embodiments described are by way of example only. Accordingly, the receiver circuit for correcting skew, semiconductor apparatus and system including the same described herein should not be limited based on the described embodiments. Rather, the receiver circuit for correcting skew, semiconductor apparatus and system including the same described herein should only be limited in light of the claims that follow when taken in conjunction with the above description and accompanying drawings.

What is claimed is:

1. A semiconductor apparatus comprising a semiconductor chip including:
    a second pad including a first metal layer coupled to a first pad and a second metal layer coupled to a through-via;
    a bump stacked on the first and second metal layers; and a path detour unit configured to electrically couple the first and second metal layers in response to a control signal, wherein the first and second metal layers are electrically isolated from each other.

2. The semiconductor apparatus of claim 1, wherein the control signal is generated when the bump does not have contact with at least one of the first and second metal layers.

3. The semiconductor apparatus of claim 1, wherein the first pad receives a signal from outside the semiconductor apparatus.

4. The semiconductor apparatus of claim 1, wherein the second pad is configured to receive a signal from a controller chip through the bump.

5. A semiconductor apparatus comprising a semiconductor chip including:
 a second pad including a first metal layer coupled to a first pad and a second metal layer coupled to a through-via;
 a bump stacked on the first and second metal layers; and
 a path detour unit configured to bypass the second pad and electrically couple the first pad to the through-via in response to a control signal
 wherein the first and second metal layers are electrically isolated from each other.

6. A semiconductor apparatus comprising a semiconductor chip including:
 a direct access pad configured to receive data from external to the semiconductor apparatus;
 an interface pad including first and second metal layers, which are electrically isolated from each other, and over which a bump is stacked;
 a write unit electrically coupled to the second metal layer, and configured to transmit data, which is received from the second metal layer, to a through-via; and
 a read unit configured to transmit data, which is received from the through-via, to the direct access pad.

7. The semiconductor apparatus of claim 6, wherein the semiconductor chip further includes a path detour unit configured to electrically couple the first and second metal layers in response to a control signal.

8. The semiconductor apparatus of claim 7, wherein the control signal is generated when the bump does not have contact with at least one of the first and second metal layers.

9. The semiconductor apparatus of claim 6, wherein the semiconductor apparatus further includes a path detour unit configured to electrically couple the direct access pad to the through-via in response to a control signal.

10. The semiconductor apparatus of claim 6, wherein the through-via provides an electrical connection to another semiconductor chip.

11. The semiconductor apparatus of claim 6, wherein the semiconductor chip is configured to receive data from a controller chip through the bump and the interface pad.

* * * * *